United States Patent [19]

Heeren

[11] 4,004,284

[45] Jan. 18, 1977

[54] BINARY VOLTAGE-DIFFERENTIAL SENSING CIRCUITS, AND SENSE/REFRESH AMPLIFIER CIRCUITS FOR RANDOM-ACCESS MEMORIES

[75] Inventor: Richard H. Heeren, Palatine, Ill.

[73] Assignee: Teletype Corporation, Skokie, Ill.

[22] Filed: Mar. 5, 1975

[21] Appl. No.: 555,482

[52] U.S. Cl. .................. 340/173 DR; 340/173 FF; 340/173 CA
[51] Int. Cl.² .................. G11C 7/06; G11C 11/24
[58] Field of Search ... 340/173 R, 173 FF, 173 CA, 340/173 DR; 307/238, 246, 279, 291

[56] References Cited

UNITED STATES PATENTS

| | | | |
|---|---|---|---|
| 3,760,381 | 9/1973 | Yao | 340/173 R |
| 3,774,176 | 11/1973 | Stein et al. | 340/173 FF |
| 3,838,404 | 9/1974 | Heeren | 340/173 DR |
| 3,868,656 | 2/1975 | Stein et al. | 340/173 FF |
| 3,892,984 | 7/1975 | Stein | 340/173 FF |

OTHER PUBLICATIONS

Kraft et al., Low–Power Gated FET Latch, IBM Technical Disclosure Bulletin, vol. 15, No. 7, Dec. 1972, p. 2280.

Primary Examiner—Stuart N. Hecker
Attorney, Agent, or Firm—W. G. Dosse; M. Pfeffer

[57] ABSTRACT

In one example, a generally conventional flip-flop circuit is used, including a pair of input field-effect transistors having their gates connected respectively to a pair of circuit nodes A and B. During a preset portion of the cycle, both nodes A and B are preset to an initial reference potential $V_R$, set so that the transistors turn partially ON and act as variable resistors. Thereafter, an unknown voltage $V_X$ to be sensed is connected to node A, $V_X$ being equal to $V_R \pm \Delta V$. The flip flop then responds to differential conductivity between the transistors, to produce a binary output voltage at one of two levels set by the sense of $\Delta V$, plus or minus.

In a semiconductor RAM circuit, selected memory cell capacitors are connected in sequence to node A, and the flip-flop circuit senses the cell charge and produces an amplified output representative thereof, which is later fed back to the memory cell to refresh the charge originally stored therein.

7 Claims, 7 Drawing Figures

BINARY VOLTAGE-DIFFERENTIAL SENSING CIRCUITS, AND SENSE/REFRESH AMPLIFIER CIRCUITS FOR RANDOM-ACCESS MEMORIES

INTRODUCTION AND BACKGROUND

This application relates generally to binary voltage-differential sensing circuits, and particularly to differential amplifier circuits for sensing small differences in potential between two circuit points or nodes, and producing an amplified binary output set by the sense (plus or minus) of the potential difference. Such differential amplifier circuits are particularly useful in sense/refresh amplifier circuits for semiconductor random-access memory (RAM) circuits.

In accordance with one typical type of prior known RAM circuit, such as described in my prior U.S. Pat. No. 3,838,404, herein incorporated by reference, a binary charge (0 volts or a cell charge $V_M$) on a semiconductor memory cell capacitor is sensed by racing balanced load capacitances up or down from a preset equal state to unbalance a flip-flop circuit of the sense/refresh amplifier and set a binary output related to the sensed charge on the cell capacitor. One problem with this technique is that it requires very closely balanced values of load capacitance, which is difficult to achieve in manufacture and the final values of which are hard to predict prior to manufacture of each chip.

This requirement of balanced load capacitances on either side of the sense/refresh amplifier makes it particularly difficult to fabricate a "single-ended" or one-sided semiconductor memory, with a large array of memory cells located together in a single area of the chip; that is, all on one side of the sense/refresh amplifier section. As described in my prior patent, with balanced load capacitances to sense memory cell voltages, it is most convenient to divide the memory cells into two equal banks, one on either side of the sense/refresh amplifier, for input/output to and from the amplifier on opposite sides. With this arrangement the values of distributed load capacitance on each side tend to be equalized in the manufacturing process.

OBJECTS AND SUMMARY

A specific object of this invention is to provide new and improved one-sided memories, of the general type described above, where there is no requirement to fabricate balanced load capacitances to sense cell voltage.

More general objects are to provide new and improved circuits for sensing small differences in potential between two circuit nodes, and producing an output voltage based on the sense of the potential difference, particularly for use in a sense/refresh amplifier for random-access semiconductor memory cells.

In accordance with one specific embodiment of the invention, a binary voltage differential sensing circuit includes a pair of matched field-effect devices having their gates connected respectively to a pair of circuit nodes A and B. Prior to a time $t_1$, both nodes A and B are preset to an initial reference potential $V_R$, selected so that the devices turn partially ON and act as variable resistors. The conductivity through each device in the range of $V_R \pm \Delta V$ is a function of applied gate voltage. At time $t_1$, an unknown voltage $V_X$ to be sensed is connected to node A, $V_X$ being equal to $V_R \pm \Delta V$. At this point, flip-flop means responds to a difference in conductivity between the two devices for generating a binary output voltage $V_O$ at one of two levels set by the sense of $\Delta V$.

In a typical example of the circuit, as used in sensing and amplifying the charge on a semiconductor memory cell capacitor of the type described, the cell charge is $V_X$, being either approximately zero volts or a cell voltage $V_M$, based on the value of binary data stored on the cell capacitor. In this example $V_R$ is preferably set in the vicinity of midway between 0 and $V_M$. The flip-flop means then generates an amplified binary output $V_O$ of approximately 0 volts or a charging voltage $V_C$, based on the state of the cell capacitor. Preferably, the flip-flop means is arranged to produce an output of 0 volts or a charging voltage respectively corresponding to a charge 0 volts or $V_M$ on the cell capacitor, and the output signal $V_O$ is fed back to the cell capacitor after the flip flop has operated to refresh the charge originally stored on the cell capacitor. The maximum cell charge $V_M$ is then set by the charging voltage $V_C$.

Other objects, advantages, and features of the invention will be apparent from the following detailed description of specific embodiments and examples thereof, when read in connection with the accompanying drawings.

DETAILED DESCRIPTION

Introduction and Background

Figure 1:
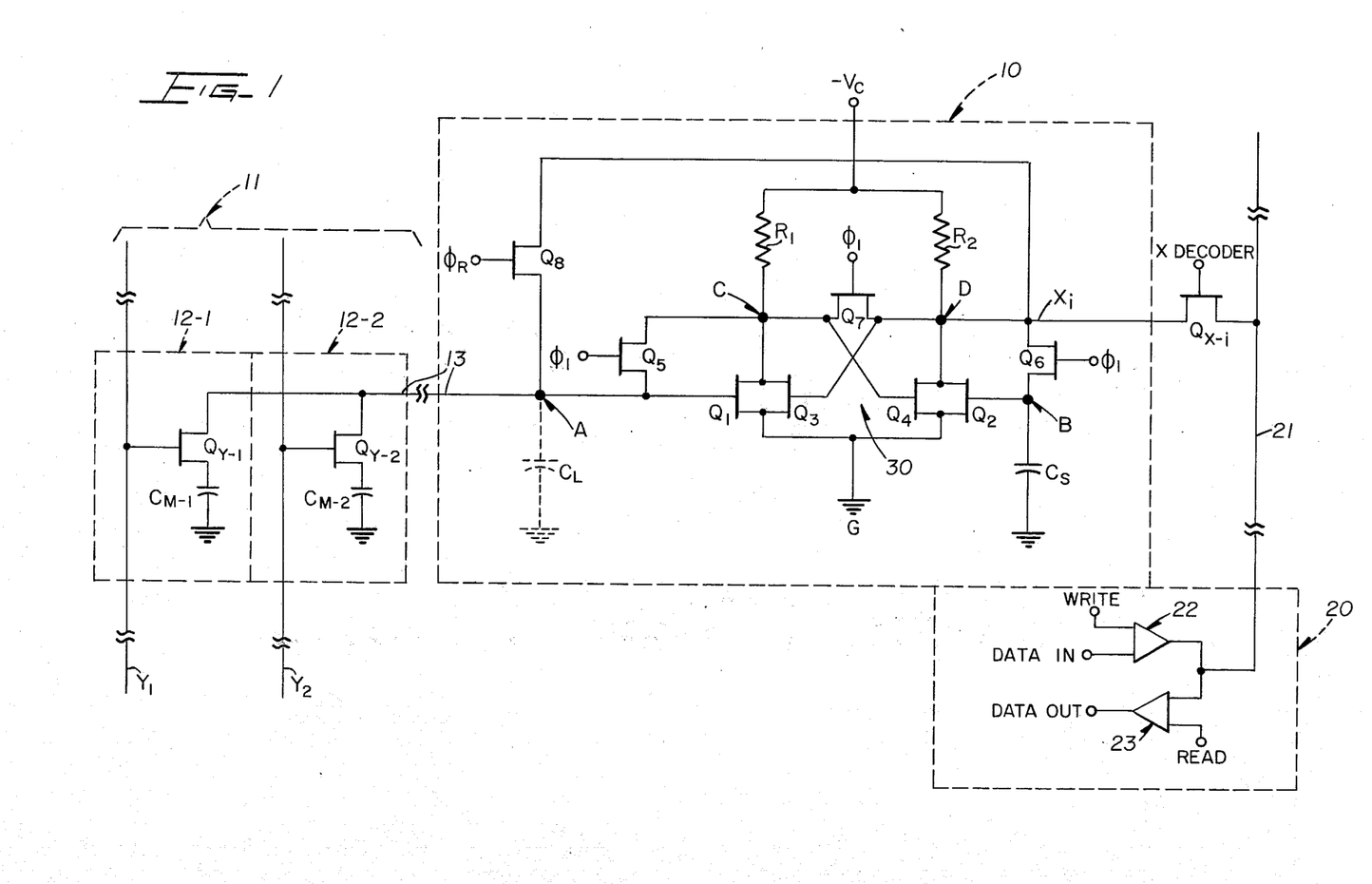
FIG. 1 is a schematic circuit diagram of portions of a memory including a sense-refresh amplifier in accordance with a first embodiment of this invention.

Referring now in detail to the drawings, FIG. 1 illustrates relevant portions of a semiconductor random access memory (RAM) generally in accordance with the system described in my prior U.S. Pat. No. 3,838,404, but including a sense/refresh amplifier 10 in accordance with a first specific embodiment of this invention. To review the construction and operation of the RAM briefly, it includes a memory section 11 having a plurality of rows of individual memory cells, such as 12-1, 12-2..., any selected one of which can be connected to a first input/output node A of the S/R amplifier 10 for that row of cells by an input/output conductor 13. As will be described hereafter, the amplifier 10 includes outer nodes A and B and inner nodes C and D.

Memory cells of this general type are very well known in the art, and there are a great many varieties that can be used with the S/R amplifier of this invention. In the example illustrated, a typical array of MOS memory cells 12 is shown, each including a Y-access gate, such as a field-effect transistor $Q_{Y-1}$, $Q_{Y-2}$ having its gate connected to a corresponding Y-access or column conductor $Y_1$, $Y_2$. As is well known in the art, the column conductors $Y_1$, $Y_2$... are energized in a prescribed sequence so as to access each cell 12 in a row (such as 13) during successive cycles of operation of the amplifier 10, to sense and refresh the data stored in each cell at preset intervals, and to read the stored data or write fresh data whenever desired.

When a given Y conductor is energized, the selected cell transistor $Q_y$ turns ON to connect a memory cell capacitor, such as $C_{M-1}$, $C_{M-2}$ to the I/O conductor or bus 13 associated with the particular row of cells. In the embodiment illustrated, all transistors are generally conventional P-channel MOS devices, and the cell capacitors $C_M$ store either a charge of $-V_M$ or zero volts, depending on the binary logic state (for example, "1" or "0") of the data stored in each cell, as will be explained hereafter.

When a cell capacitor $C_M$ is connected via the I/O bus 13 to the input/output node A of the sense/refresh amplifier 10 during a cycle of operation, the amplifier 10 senses the signal previously stored on the cell capacitor $C_M$; delivers an amplified output to a read/write circuit 20 when desired; accepts a new data input from the R/W circuit 20 when desired; and refreshes the prior charge (or stores a new one in a writing cycle) on the cell capacitor $C_M$ near the end of the cycle, as will be explained hereafter. Further details of operation of typical memory cells 12 of this type, Y inputs, and cell constructions are described in my prior patent and in my copending application, Ser. No. 427,874, filed Dec. 26, 1973, now U.S. Pat. No. 3,893,146, issued July 1, 1975.

Various types of read/write circuits 20 are well known in the art, one typical example being described in my prior patent. In the embodiment illustrated, a second input/output node D of the S/R amplifier 10 is connected by a row input/output conductor or bus $X_i$ to an X-access gate, such as a transistor $Q_{X-i}$. When energized by conventional X decoding circuitry during a portion of any given cycle, the X-access transistor $Q_X$ of any selected row connects the amplifier 10 in that row to the read/write circuitry 20 via a common read/write bus 21. It should be understood that there are typically a great many rows of X busses similar to $X_i$, each of which is connected to an amplifier 10 associated with that bus for reading from or writing into any selected cell 12 of a row of memory cells associated with that amplifier.

Thus, the X-access transistors, such as $Q_i$, selectively connect node D of the sense/refresh amplifier to either a "write" amplifier 22 or a "read" amplifier 23 during any cycle in which one desires either to write data into a selected cell 12 in a given row, such as $X_i$, or to read data from any selected cell in the row. As is well known, the write amplifier 22 responds to a "write" input and a data input to apply a fresh data signal ($-V$ or 0 volts) to node D of the amplifier 10 through a selected X-access transistor $Q_X$ and the amplifier 10 responds as will be described hereafter to write the new data on the selected cell capacitor $C_M$. Similarly, to read data from any cell 12, the X-access transistor $Q_X$ is turned ON to connect the amplifier node D to the read amplifier 23, which provides a data output from the RAM when a "read" input is also applied to the read amplifier 23, as is well known in the art. Further details of operation of this type of read/write circuitry 20 are described in my prior patent.

This Application --- Sense/Refresh Amplifier, First Embodiment

Referring further to FIG. 1, a sense-refresh amplifier 10 in accordance with a first embodiment of this invention includes a pair of matched differential-input field-effect devices, such as transistors $Q_1$, $Q_2$ having their gates connected respectively to the "outer" circuit nodes A and B of the amplifier 10. In essence, the input transistors $Q_1$, $Q_2$ sense very small differences in potential between the outer nodes A and B during a cycle, to trigger a generally conventional flip-flop circuit 30 to one of two stable states, corresponding either to a 1 output at the "inner" node D and 0 at the "inner" node C, or to a 0 at node D and a 1 at node C. As will be explained in the following paragraphs, in the embodiment illustrated, for sensing and refreshing the charge on a RAM cell such as 12, the A input rises or falls slightly with respect to the B input during a "sensing" portion of each cycle, which triggers the flip-flop 30 so that the D output thereafter consists of an amplified binary replica of the charge on the memory cell 12. During a subsequent "refresh" portion of the cycle, the D output is fed back to the RAM cell to restore the signal originally stored.

Various types of flip-flops circuits 30 are well known in the art, one typical example illustrated in FIG. 1 being similar to that illustrated in FIG. 6 of my prior patent cited above. In this example, the flip-flop 30 includes a pair of transistors $Q_3$, $Q_4$ having their source/drain terminals respectively connected in parallel with those of the input transistors $Q_1$, $Q_2$. The common drains of transistors $Q_1$, $Q_3$ define amplifier node C and the common drains of $Q_2$, $Q_4$ define the input/output node D, these being defined herein as "inner" nodes for purposes of distinction from the "outer" nodes A and B. As is standard practice in this type of flip-flop circuit, the inner nodes C and D are connected to a source of charging potential $-V_C$ through a pair of load resistors $R_1$, $R_2$, which may be ON-biased FETs as described in my prior patent. As is also conventional, the common sources of transistors $Q_1$, $Q_2$, $Q_3$, $Q_4$ are connected to circuit ground G; and the gates of $Q_3$, $Q_4$ are connected respectively to nodes D and C.

Figure 2:
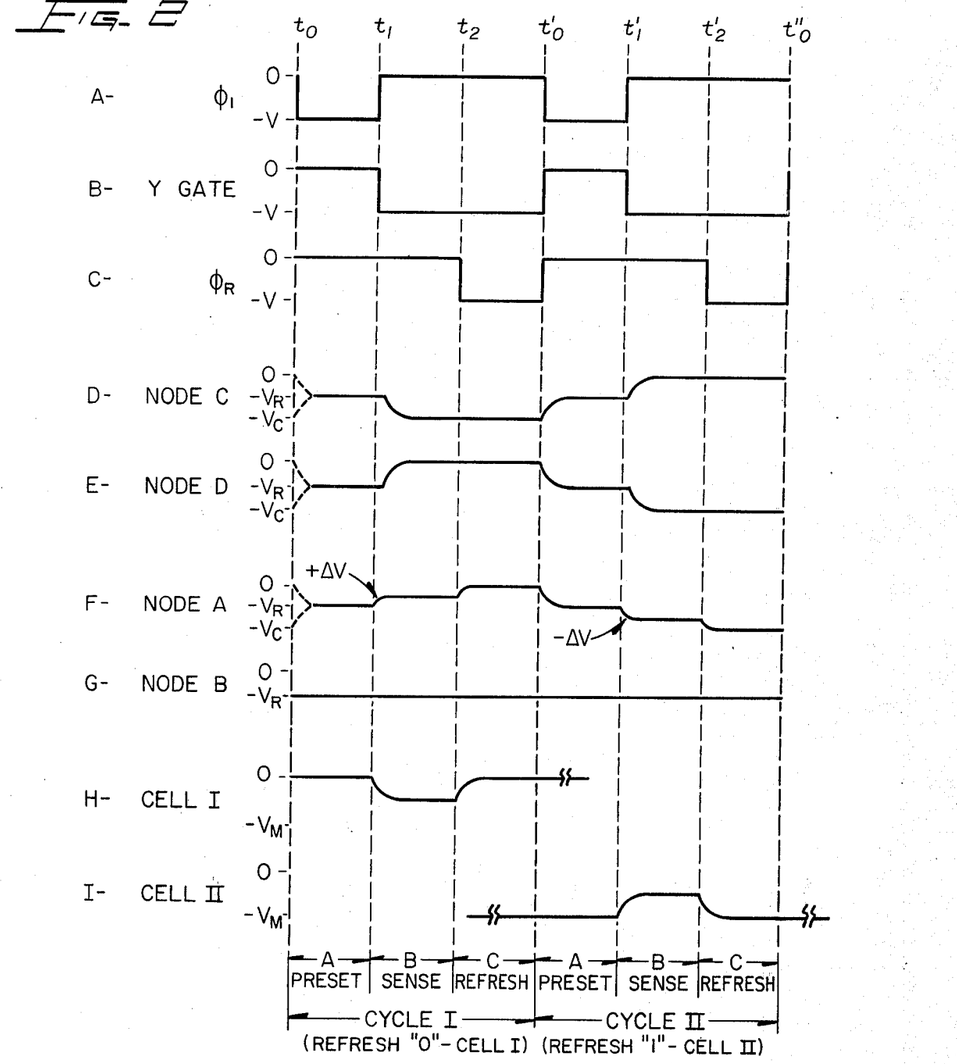
FIG. 2, including 2A through 2I, is a graphical representation of waveforms appearing at various times in the diagram of FIG. 1.

During a first or "preset" portion A of each cycle, times $t_0-t_1$ in FIG. 2, a clock pulse $\phi_1$ goes to $-V$ (FIG. 2A), which turns ON a group of shorting transistors $Q_5$, $Q_6$, $Q_7$ to equalize the potential at amplifier nodes A and B and at nodes C and D. In the embodiment illustrated in FIG. 1, the initial potential at all four nodes is preset equal to an intermediate reference potential $-V_R$, which in this example is approximately midway between ground and the charging voltage $-V_C$. In a typical example of the FIG. 1 circuit, the reference voltage $-V_R$ is set equal to approximately half the charging voltage $-V_C$, or about $-2\frac{1}{2}$ volts in a typical example where the charging voltage is $-5$ volts.

The reference voltage $-V_R$ is selected so that the differential input transistors $Q_1$, $Q_2$ turn partially ON and function as variable resistors, in series with $R_1$, $R_2$ to conduct the charging voltage $-V_C$ to circuit ground G. In this embodiment, the initial voltage at nodes C and D is also equalized at $-V_R$, so that the flip-flop transistors $Q_3$, $Q_4$ also turn partially ON to connect $-V_C$ to ground through the parallel combinations of $Q_1$, $Q_3$ on the left side and $Q_2$ and $Q_4$ on the right side. The effect of turning $Q_3$ and $Q_4$ partially ON at this point is generally as described in connection with FIG. 6 of my prior patent.

In the FIG. 1 embodiment, the shorting transistor $Q_7$ connects node C to node D. As will be explained hereafter, at the end of each cycle, one of nodes C or D is always at ground potential and the other at a voltage approaching $-V_C$; thus during the preset stage A of the following cycle, $t_0$ to $t_1$ set by the clock pulse $\phi_1$, operation of $Q_7$ equalizes the potential at nodes C and D at a value $-V_R$ equal to approximately half of $-V_C$, as indicated in FIGS. 2D and E, cycle I at the left of FIG. 2. Similarly, $Q_5$ connects node C to node A and $Q_6$ connects node D to node B, so that all four nodes equalize at the intermediate voltage $-V_R$ by cycle time $t_1$, as indicated in FIG. 2, F and G, during the preset portion A of the cycle.

At the end of the preset stage A, indicated as cycle time $t_1$ in FIG. 2, the clock pulse $\phi_1$ returns to ground to turn OFF the shorting transistors $Q_5$, $Q_6$ and $Q_7$ so as to isolate the nodes A, B, C, and D from each other and the sense/refresh amplifier 10 is now conditioned for a sensing operation on a selected memory cell 12.

Near the time $t_1$, a selected one of the Y-access conductors $Y_1$, $Y_2$... is energized, as described above, to turn ON a selected memory cell transistor $Q_Y$ thus connecting the associated memory cell capacitor $C_M$ to node C through the I/0 conductor 13.

In a first example of operation, designated cycle I at the left of FIG. 2, it is desired to sense and refresh a charge of zero volts stored on one of the cell capacitors $C_M$. In this case, when the selected cell capacitor $C_M$ is connected to amplifier node A at time $t_1$, a portion of the initial reference voltage $-V_R$ at node A is dumped to the cell capacitor C, which lowers the voltage at the node A by a small amount, as illustrated in exaggerated fashion by the arrow $+\Delta V$ in stage B of FIG. 2F. Due to the very small values of cell capacitance $C_M$ used in RAMs of this type (for example 0.4 pf), the voltage at node A actually drops by only a few millivolts when connected to a cell capacitor $C_M$ storing zero volts.

The node A voltage is applied to the gate of the differential input transistors $Q_1$, which is equipped to sense very small differences in voltage between the outer nodes A and B, as previously mentioned. As the voltage at node A drops slightly in this example, this increases the resistance of $Q_1$ with respect to $Q_2$. As a result, the voltage increases at the inner node C with respect to node D sufficiently to turn ON the flip-flop transistor $Q_4$ and to turn OFF the flip-flop transistor $Q_3$ as described in my prior patent.

In this case, the voltage at node C builds up to approximately the charging potential $-V_C$ and the voltage at node D drops to near ground, as node D discharges to circuit ground G through the ON flip-flop transistor $Q_4$, as indicated in FIGS. 2D and 2E, during sensing interval B, times $t_1$—$t_2$. At this point, shortly after $t_1$, a zero volt or near zero volt charge on the cell capacitor $C_M$ has effectively been sensed and transferred to node D, from which node it may be read out when desired by the read/write circuitry 20.

As is well known, in this type of RAM, a near zero volt charge initially stored on any cell capacitor can over the course of time built up to a small charge due to parasitic coupling of one form or another. But in such cases, this small error charge is substantially less than the reference potential $-V_R$; thus, the differential input transistors $Q_1$, $Q_2$ of the amplifier 10 operate to sense any cell voltage less than $-V_R$ (that is, a lower absolute magnitude of the potential) and convert it to a more pure "0" (near circuit ground) output at node D, which is later fed back to the cell as will be described to obliterate any erroneous small change in the charge on the cell. This is the standard sense/refresh procedure, wherein every cell is sampled and the charge restored every so often (such as every 2 milliseconds in a typical example) to prevent loss of the data over time and repeated cycling of the RAM.

As previously described, reading is done by sensing the voltage on node D at any time after the operation of the flip-flop 30; that is, any time from shortly after $t_1$ to shortly before the end of the cycle ($t'_0$). The read/write circuitry 20 may be connected either to the circuit node D as illustrated, or to node C, in which latter case the sense of the data read is inverted from that stored on the cell capacitor $C_M$.

In FIG. 1, the capacitance $C_L$ at node A represents the distributed load capacitance at the node, primarily the intrinsic gate to drain and drain to body capacitances of the row of memory cell transistors $Q_{Y-1}$, $Q_{Y-2}$, etc. The capacitance $C_S$ shown connected to node B is a storage capacitance. In the sensing system of this application, there is no necessity that $C_S$ be equal or related to $C_L$ in any way.

To refresh the cell capacitor $C_M$, at a subsequent cycle time $t_2$, a refresh transistor $Q_8$ is turned ON by a refresh pulse $\phi_R$ illustrated in FIG. 2C, which connects the inner node D to the outer node A during stage C of the cycle. In the example of cycle I, where a zero volt charge is to be refreshed, node D was brought to zero volts during stage B of the cycle as described above. Thus, during the refresh stage of the cycle, node A and the cell capacitor $C_M$ connected thereto discharge to ground G through the ON transistors $Q_8$ and $Q_4$, thereby restoring the zero charge originally stored on the cell capacitor (FIG. 2H). The only requirement for the refresh pulse $\phi_R$ is that the leading edge occur after the trailing edge of $\phi_1$, and in practice $\phi_R$ can conveniently be a delayed $\phi_1$ pulse.

At the end of cycle I, time $t'_0$, the refresh clock pulse $\phi_R$ returns to ground (FIG. 8C) to isolate node A from node D, and the Y access conductor such as $Y_1$ also returns to ground (FIG. 2B) to turn OFF the cell transistor $Q_Y$ and isolate the memory cell capacitor $C_M$ from node A, with the zero or near zero volt charge freshly restored thereon by the amplifier 10 as a pure zero. At time $t'_0$, the refresh operation has been completed and the amplifier 10 is prepared for another operation, designated cycle II in FIG. 2.

In cycle II, illustrated at the right side of FIG. 2, a second example is given, to sense and then refresh a 1 charge stored on a different, selected cell capacitor $C_M$. In this case, the first or preset stage of the cycle, II-A, is exactly the same as described above in cycle I. At the start of cycle II, time $t'_0$, the clock pulse $\phi_1$ again goes negative to turn ON the shorting transistors $Q_5$, $Q_6$ and $Q_7$. When this happens, the $-V_C$ charge remaining on node C at the end of cycle I is shared with nodes A, D and B during the preset stage A of cycle II, which returns all four nodes to the intermediate reference potential $-V_R$ prior to time $t'_1$ previously described and as illustrated in FIGS. 2D, E, F and G.

At time $t'_1$, the clock pulse $\phi_1$ returns to ground to re-isolate the nodes A, B, C, D, as previously described, and the amplifier 10 is conditioned for the next sensing operation, starting at time $t'_1$, when a selected Y-access conductor $Y_1$, $Y_2$, is energized (FIG. 2B) as in cycle I, to connect the associated memory cell capacitor $C_M$ to node A. In this example, cycle II, the selected cell capacitor $C_M$ has been storing a charge at or near the maximum cell charge $-V_M$, representing in this example binary 1. The cell charge $-V_M$ is at some voltage preferably near the charging voltage $-V_C$, as will be explained hereafter, or about −4 volts in the example given above. In any case, the cell voltage $-V_M$ must be somewhat greater (more negative in this example) than the reference voltage $-V_R$, so that the input transistors $Q_1$, $Q_2$ can sense the difference between $-V_M$ and $-V_R$ and thereby trigger the flip-flop 30 in the opposite direction, as explained in the following paragraph.

When a charged cell capacitor $C_M$ is connected to node A at time $t'_1$, the higher (more negative) cell voltage $-V_M$ adds to the reference voltage $-V_R$ applied to node A, to increase the voltage applied to the gate of the sensing transistor $Q_1$ by a small amount, designated $-\Delta V$ in FIG. 2F and typically a few millivolts in a RAM of this type. This results in increased conductivity through the transistors $Q_1$ relative to $Q_2$, which raises the potential at node D with respect to node C and triggers the flip-flop 30 in the opposite direction. In this case, the flip-flop transistor $Q_3$ turns ON to discharge node C to ground G through $Q_3$, and the transistor $Q_4$ turns fully OFF. The potential at node D thereafter increases to approximately the charging potential $-V_C$, as illustrated in FIG. 2E, cycle II.

As previously described in connection with sensing a zero volt cell charge, the maximum cell charge $-V_M$ tends to deteriorate with time, as is well known, due to various parasitic coupling and leakage currents. However, the differential input transistors $Q_1$, $Q_2$ function to sense a cell charge lower than $-V_M$ but greater (more negative) than the intermediate voltage $-V_R$ and record it as a 1, that is, a charged cell capacitor in this example. As explained hereafter, the amplifier 10 later feeds back a voltage that sets the full charge $-V_M$ on the cell, to restore it to its original condition and to obliterate any effect of deterioration of cell voltage since a previous refresh cycle. Of course, as is well known, each cell must be refreshed sufficiently often that the 1 charge is not lost; in this example, that it does not fall so close to $-V_R$ that the input transistors $Q_1$, $Q_2$ cannot sense a small difference between the reference voltage $-V_R$ and the augmented voltage applied to node A by a charged cell capacitor.

In this example, at a time shortly after $t'_1$, the sensing operation is complete and the amplifier output D at $-V_C$ volts, indicating a binary 1 charge on the cell capacitor $C_M$, may be read from node D by the read/write circuitry 20, as described above and in my prior patent. To refresh the 1 charge on the cell capacitor $C_M$, at cycle time $t'_2$, the refresh transistor $Q_8$ is again operated to connect node A to node D. In this case, the $-V_C$ output signal at node D is applied via node A to the cell capacitor $C_M$, to charge the cell capacitor back to the desired, nominal cell voltage $-V_M$, which is a preset fraction of the charging voltage $-V_C$ and preferably is nearly equal to $-V_C$. In a typical example given above, $-V_C$ is approximately −5 volts, which produces a cell charge of approximately −4 volts. Writing is done in essentially the same way as described in the prior patent. To write a 0, a ground data input signal is applied to node D at time $t_1$ through the write amplifier 22 and X decoder $Q_X$, which overrides the effect of any previous charge on the cell capacitor $C_M$. In this case, flip-flop transistor $Q_3$ turns OFF and transistor $Q_4$ turns ON at once, and the fresh 0 is stored at node D and later transferred to the selected cell 12 through $Q_8$ during the refresh portion of the cycle, at time $t_2$. Similary, to write a 1, a strong −V data input signal is momentarily applied to node D at time $t_1$, to turn $Q_3$ ON and $Q_4$ OFF, thus storing a $-V_C$ signal at node D for transfer to the memory cell 12 at time $t_2$.

In view of the above description of the first embodiment of the invention, it should be apparent that the transistors $Q_1$, $Q_2$, $Q_3$ and $Q_4$ operate as a binary differential amplifier, for sensing a small difference in potential between the outer nodes A and B, when a cell capacitor $C_M$ is switched into the circuit at node A during the sensing portion of the cycle. The differential input transistors $Q_1$ and $Q_2$ sense this difference by becoming unbalanced, and the flip-flop transistors $Q_3$ and $Q_4$ then respond to the unbalance (differential conductivity of $Q_1$, $Q_2$) to set a binary output voltage at node D, based on the sense of the voltage difference between nodes A and B. In this embodiment, the binary output of the flip-flop 30, at node D, comprises an amplified replica of the previous charge on the cell capacitor $C_M$, and can be fed back to the cell capacitor $C_M$ to refresh the initial state.

Second Embodiment - General Principles

Figure 3:
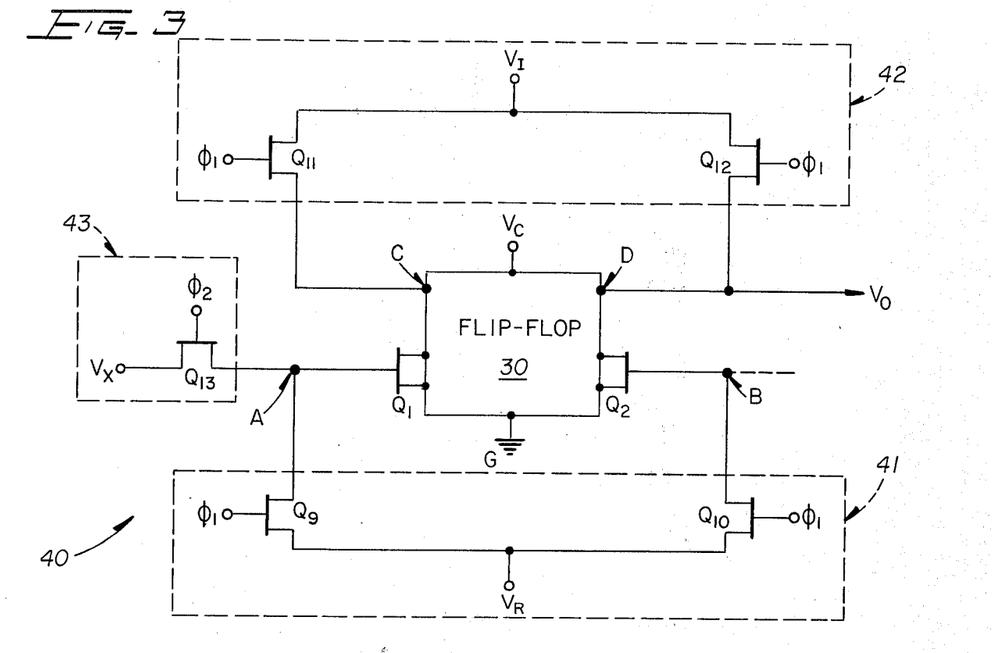
FIG. 3 is a circuit diagram of a binary differential amplifier in accordance with a second embodiment of the invention, and also represents a generalized version of the circuit of FIG. 1.

FIG. 3 illustrates a binary differential amplifier circuit 40 in accordance with a second embodiment of the invention, and also represents a generalized version of the specific circuit of FIG. 1, illustrating certain principles and features of the invention. In FIG. 3, the elements $Q_1$, $Q_2$; flip-flop 30; nodes A, B, C, D; clock pulse $\phi_1$; and voltages $V_C$ and $V_R$ are or can be essentially the same as those described in connection with FIG. 1. Also, in FIG. 3, the signs of the voltage inputs $V_R$, $V_C$, etc. have been omitted, since it should be apparent that with other types of circuitry, for example N-channel field effect devices, positive inputs would be used.

In FIG. 3, a pair of gating transistors $Q_9$, $Q_{10}$ are illustrated to preset the initial potential at nodes A and B equal to a reference potential $V_R$, as previously described, set so that the input transistors $Q_1$, $Q_2$ are balanced and turn partially ON to act as variable resistors, the conductivity through which in the range of $V_R \pm \Delta V$ is a function of applied gate voltage. In a general sense, the transistors or gates $Q_9$, $Q_{10}$ comprise means 41 for presetting the initial potential at nodes A and B equal to the reference potential $V_R$. In FIG. 1, this corresponding means includes the shorting transistors $Q_5$, $Q_6$, and $Q_7$, which as previously described establish the preset reference potential at nodes A and B at a desired value equal to approximately half of $V_C$ in that embodiment. In practice, $V_R$ can be any internally generated voltage capable of setting the desired initial level, $V_R$, as in FIG. 1, or it can be an external source of potential.

In FIG. 3, a further pair of transistors $Q_{11}$, $Q_{12}$ operate during the preset state to equalize the potential at the inner flip-flop nodes C and D at an intermediate voltage $V_I$, which in practice can be any value from zero volts up to $V_C$. Broadly, the transistors $Q_{11}$, $Q_{12}$ comprise means 42 for presetting the voltage at nodes C and D at the initial potential $V_1$. In the FIG. 1 embodiment, the means 42 comprises the shorting transistor $Q_7$, in which case the initial voltage $V_1$ at nodes C and D is the same as the reference potential $V_R$ at nodes A aand B. But $V_I$ can be higher than $V_R$ or lower, so far as the operation of the circuit is concerned. For example, in FIG. 3, of my prior U.S. Pat. No. 3,838,404, a circuit is illustrated for equalizing both nodes C and D at circuit ground potential, which will work well in the practice of this invention. Similary, in FIGS. 4-6 described hereafter, both nodes are started at approximately $V_C$.

In all such cases, the flip-flop 30 will respond to differences in conductivity between the input transistors $Q_1$ and $Q_2$ to set the flip flop in one direction or the other, as described in connection with the first embodiment above. In FIG. 3, the flip-flop 30 is shown in general form by a labeled rectangle, since it should be apparent that various other types of flip flop can be used than the specific circuit illustrated in FIG. 1.

In generalized form, the differential amplifier circuit 40 of FIG. 3 operates as follows:

1. Prior to a cycle time $t_1$ (between times $t_0$ and $t_1$ in potential $V_R$ (means 41), and preset nodes C and D equal to an initial potential $V_I$ (means 42) as described above.

2. At time $t_1$, isolate nodes A, B, C and D from each other, and the cell is now balanced.

3. At or after time $t_1$, apply an unknown or varialbe input voltage $V_X$ to node A (or node B). If $V_X$ differs from $V_R$ by $\pm \Delta V$, the flip-flop 30 will unbalance and produce a binary output voltage $V_O$ at node D (or C) at one of two levels set by the sense of $\Delta V$ (plus or minus).

In the example of FIG. 3, a means 43 is illustrated in general form for performing step (3) above, applying the unknown voltage $V_X$ to node A at cycle time $t_1$. In this example, the means 43 includes a gate, such as a transistor $Q_{13}$, which in FIG. 1 corresponds to any selected one of the cell transistors $Q_Y$. The transistor $Q_{13}$ is operated by a subsequent clock pulse $\phi_2$, which corresponds to the energization of a selected one of the Y-access conductor in FIGS. 1 and 2B, to connect the variable input voltage $V_X$ to node A at (or after) cycle time $t_1$ in FIG. 2.

In a RAM system of the type under consideration in FIG. 1, the variable input voltage $V_X$ corresponds to the cell voltage, which is always either higher ($V_M$) or lower (circuit ground) in absolute value than the reference potential $V_R$, because of the selection of $V_R$ as previously described to be between the two possible values of $V_X$.

Of course, the input $V_X$ to be sensed can be connected equally well to node B, and the output $V_O$ can be taken from node C or D. If an input is applied to node A and the output taken from node C, the output is inverted from the input; that is, a 0 input at node A generates a 1 output node C, and vice versa. Whereas, the node D output is of the same sense as a node A input, as previously described.

While the sensing circuits described herein can be used in any application where it is desired to compare an unknown or variable voltage $V_X = V_R \pm \Delta V$ with a reference potential $V_R$, to produce a binary output voltage $V_O$ at one of two levels set by the sense of $\Delta V$, the circuits are especially useful in random access memories of the type described above. In this application of the circuit, $V_X$ is a variable binary charge stored on a semiconductor memory cell capacitor, and the magnitude of $\Delta V$ applicable to node A is very small, such as a few millivolts as compared to $-2.5$ volts for $V_R$ and $-5$ volts for $V_C$.

A differential amplifier circuit according to this invention is more sensitive in sensing small voltage differentials than the racing of balanced load capacitors as described in my prior patent, which means that smaller cell capacitances can be built, preferably semiconductor capacitors of the type described in my copending application, Ser. No. 427,874, cited above, now U.S. Pat. No. 3,893,146. Also, the use of differential input transistors $Q_1$, $Q_2$ obviates the need in the racing capacitance system of my prior patent that two load capacitances (corresponding to $C_L$ and $C_S$ in FIG. 1) be substantially identical in value. In the embodiments of this invention, there is no requirement that the capacitance $C_L$ at node A be the same as or close to the capacitance $C_S$ at node B, since the identical reference voltage $V_R$ is applied by unequal capacitances.

This freedom from the need to balance the two load capacitances, such as $C_L$ and $C_S$, resulting from the differential amplifier circuit, leads to further important advantages in circuit construction and processing. One advantage of this system is that a "single-ended" or one-sided RAM can readily be constructed, in which all of the memory cells 12—12 can be manufactured together in a single section on the chip, to the left of the S/R amplifier 10 in FIG. 1, rather than being split into two equally balanced sections with half of the cells on either side of the amplifier 10 as described in my prior patent. This has substantial advantages in simplicity of manufacture and in eliminating requirements that the load capacitances of both sides of such symmetrical memory arrays be precisely balanced.

With the prior circuis, due to manufacturing process vargaries, it was hard to predict exactly what would be the final values of the load capacitances. The absolute value did not matter too much, but they had to be essentially equal. The only good way to do this was to manufacture two equal groups of cells at the same time, with the expectation that the process conditions would normally produce the same total load capacitance on each side. But, if one attempted to produce a single-sided RAM with this process and for example, fabricate one of the load capacitances (corresponding to $C_S$ herein) as a discrete oxide capacitor, the precise value would be impossible to predict until the chip had been finished and the two capacitances could not readily be balanced as required in that type of RAM circuit.

Further Embodiments

Figures 4, 5, 6:
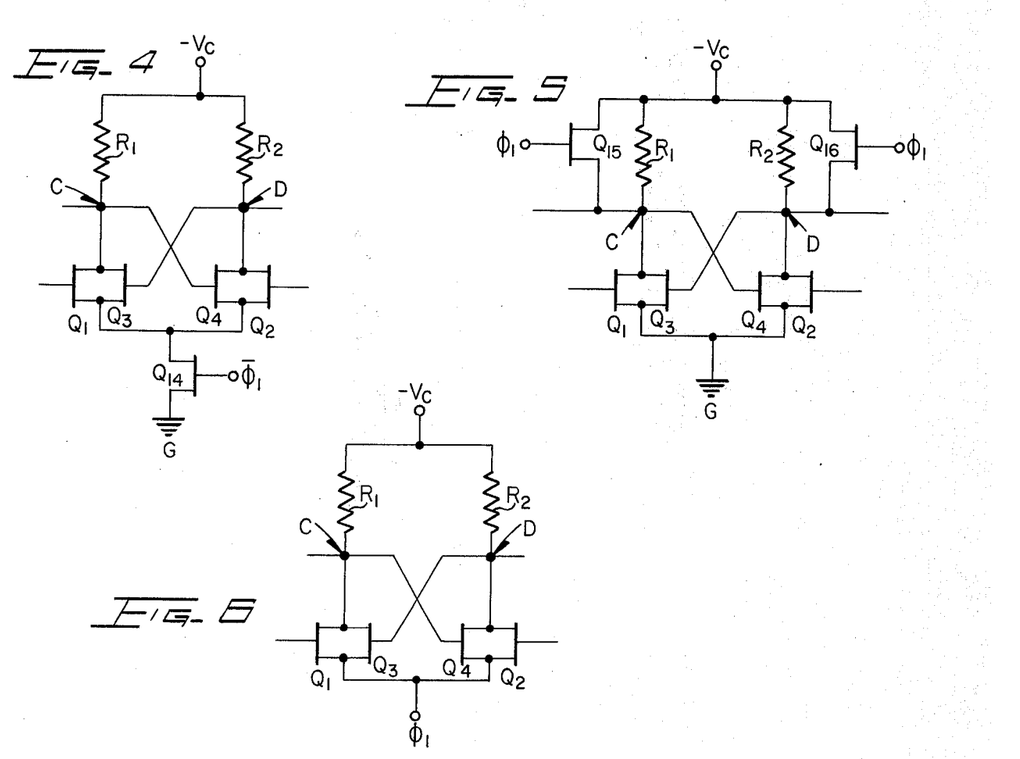
FIGS. 4–7 are circuit diagrams illustrating further specific embodiments of the invention.

FIG. 4 illustrates one simple circuit for equalizing the initial potential at nodes C and D at an initial value $V_I$ equal to approximately $-V_C$. The elements and reference characters in FIG. 4 are the same as in FIG. 1, except as noted below. In FIG. 4, the shorting transistor $Q_7$ of FIG. 1 is eliminated, and a transistor $Q_{14}$ is added, connected as shown between the common sources of flip-flop transistors $Q_3$, $Q_4$ and circuit ground G. The gate of $Q_{14}$ is connected to an inversion $\overline{\phi}_1$ of the $\phi_1$ clock pulse, to turn OFF $Q_{14}$ during the preset stage of each cycle, times $t_0$ to $t_1$ in FIG. 2, upon which the nodes C and D charge equally to a voltage approaching $-V_C$ and both flip-flop transistors $Q_3$ and $Q_4$ start in the ON condition.

At time $t_1$, FIG. 2, $\overline{\phi}_1$ returns to $-V$, thus turning $Q_{14}$ ON to connect the common sources of $Q_1$ through $Q_4$ to ground during the sensing and refresh portions of each cycle, $t_1$ to $t'_0$, so that the input transistor $Q_1$, $Q_2$ operate as described in connection with FIG. 1 to turn one or the other of the flip-flop transistors $Q_3$, $Q_4$ OFF during the sensing portion of the cycle.

FIG. 5 illustrates a further embodiment for precharging nodes C and D to an initial voltage near $-V_C$, as in FIG. 3. In FIG. 5, transistors $Q_{15}$ and $Q_{16}$ are added in parallel with $R_1$ and $R_2$ of FIG. 1, and are turned ON by the $\phi_1$ clock pulse during time slot A of FIG. 2 ($t_0-t_1$). This charges both nodes C and D to approximately $-V_C$ during the preset portion of the cycle. In this example, the resistance of $Q_{15}$ and $Q_{16}$ is made much lower than that of the load resistors $R_1$, $R_2$, such as a 1:10 ratio.

FIG. 6 is another embodiment, similar to FIGS. 4 and 5, for equalizing nodes C and D at a value near $-V_C$. In FIG. 6, the $\phi_1$ clock pulse is used as a time selecteive ground source connected to the common sources of $Q_1$ through $Q_4$. During the preset portion of each cycle, times $t_0$ to $t_1$ in FIG. 2, the $\phi_1$ pulse is negative, thus allowing nodes C and D to both charge to an initial voltage $V_1$ approximating $-V_C$. During the sensing and refresh stages of each cycle, such as times $t_1$ to $t_0$ in FIG. 2, the $\phi_1$ pulse returns to ground, and the grounded phase of the $\phi_1$ pulse serves as the circuit ground G in FIG. 1.

Figure 7:
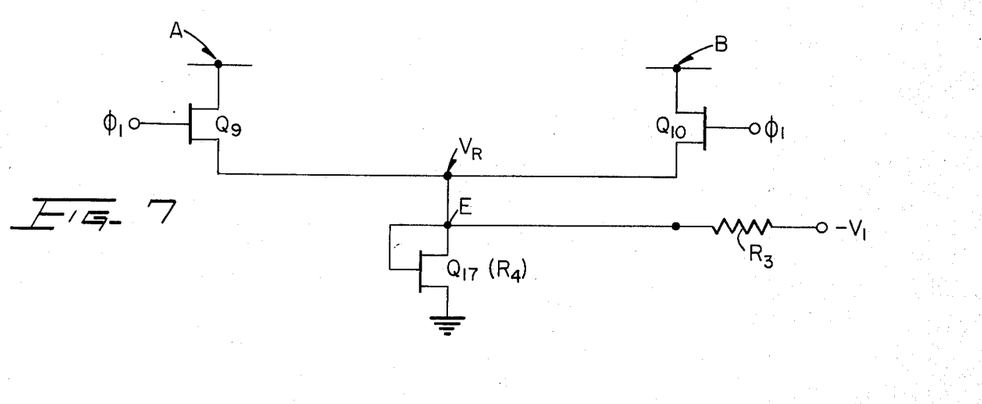

FIG. 7 is an alternate circuit, otherwise similar to FIG. 3, for equalizing the initial potential at nodes A and B at the intermediate reference potential $V_R$. Reference characters A, B, $\phi_1$, $Q_9$ and $Q_{10}$ are the same as in FIG. 3. In FIG. 7, the reference potential is derived as a preset fraction of a source voltage $-V_1$, which can be the same as $-V_1$, which can be the same as $-V_C$ or approximately $-5$ volts in the example given above. The voltage $-V_1$ is applied through a load resistance $R_3$, similar to $R_1$ or $R_2$ in FIG. 1, to a node E. A transistor $Q_{17}$ is connected with its drain and gate connected to a node E and its source connected to circuit ground. The threshold voltage of $Q_{17}$ is set to be just below the desired value of $V_R$, so that $Q_{17}$ operates as a shunt for $-V_1$ and sets the desired value $V_R$ at node E at all times. The $V_R$ potential at node E is applied to nodes A and B during the $\phi_1$ clock pulse, through transistors $Q_9$, $Q_{10}$ as previously described in connection with FIG. 3.

More generally, $Q_{17}$ and $R_3$ constitute series resistors, $R_4$, $R_3$, comprising a potentiometer, setting the desired voltage $V_R$ at the intermediate node E between the resistors. Either or both of $R_3$ and $R_4$ can be field-effect transistors, as previously described.

While various specific examples and embodiments of the invention have been described in detail herein, it will be obvious that various modifications may be made from the specific details described without departing from the spirit and scope of the invention.

What is claimed is:

1. In combination with a semiconductor random-access memory circuit of the type having a plurality of memory cell capacitors that are periodically sampled by sense/refresh amplifier circuit which senses and refreshes a binary charge stored on each cell capacitor, the cell charge being either essentially zero volts or a cell charge $V_M$, based on the value of binary data stored in a selected cell, the sense/refresh amplifier circuit including a pair of flip-flop circuit nodes, means for equalizing the potential at said nodes prior to a cycle time $t_1$, and flip-flop means for sensing a difference in potential between said nodes after time $t_1$ and for generating a binary output voltage at one of said nodes having one of two levels set in accordance with the charge stored on the selected cell capacitor, an improved sense/refresh amplifier circuit characterized by:
   a. a pair of matched, input field-effect transistors having their source/drain impedances connected respectively between the flip-flop circuit nodes and circuit ground;
   b. a pair of input circuit nodes connected respectively to the gates of the input transistors and normally not connected to the flip-flop circuit nodes during the sensing operation;
   c. means for presetting both of the input nodes at a common initial reference potential $V_R$ prior to cycle time $t_1$, $V_R$ being approximately midway between $V_M$ and zero volts and being set so that the input transistors both turn ON and operate as variable resistors, the conductivity through each of which varies with applied gate voltage above or below $V_R$; and
   d. means for connecting the selected memory cell capacitor to one of the input nodes after time $t_1$ so that the conductivity through the corresponding input transis for having its gate connected to that input node varies in accordance with the cell charge to vary the potential at the corresponding flip-flop circuit node so as to trigger the flip-flop means to produce a binary output voltage in accordance with the charge stored on the selected cell capacitor.

2. A circuit as recited in claim 1, wherein:
   I. the means for equalizing the potential at the flip-flop nodes comprises means for connecting said nodes to each other prior to cycle time $t_1$; and
   II. the means for presetting the initial reference potential at the input nodes comprises means for connecting the input nodes to the respective amplifier nodes prior to cycle/time $t_1$, so that all four nodes equalize at the same initial potential $V_R$ prior to cycle time $t_1$.

3. In combination with a semiconductor random-access memory circuit of the type having a plurality of memory cell capacitors that are periodically connected to a sense/refresh amplifier that senses and refreshes a binary charge stored on each cell capacitor, the cell charge being either essentaily zero volts or a cell charge $V_M$, based on the value of binary data stored in any selected cell, an improved sense/refresh amplifier circuit, which comprises:
   a. a pair of input circuit nodes A and B;
   b. a pair of matched, input field-effect transistors $Q_1$, $Q_2$ having their gates connected respectively to nodes A and B;
   c. means for presetting a common initial reference potential $V_R$ at both nodes A and B during a first cycle time interval $t_o$ to $t_1$, $V_R$ being approximately midway between $V_M$ and zero volts and being set so that the input transistors $Q_1$, $Q_2$ turn partially ON and operate as variable resistors, the conductivity through each of which varies with applied gate voltage above or below $V_R$;
   d. means for connecting the selected memory cell capacitor to node A during a second cycle time interval $t_1$ to $t_2$, so that the source/drain conductivity through $Q_1$ varies from that of $Q_2$ in accordance with the charge stored on the selected memory cell capacitor; and
   e. flip-flop means, responsive to a difference in source/drain conductivity between $Q_1$ and $Q_2$ after time $t_1$, for generating a binary output voltage $V_0$ of approximately $V_M$ if the cell charge was $V_M$ and approximately zero volts if the cell charge was zero volts.

4. A circuit as recited in claim 3, wherein the flip-flop means includes:
   a second pair of circuit nodes C and D, the source/drain impedance of $Q_1$ being connected between node C and circuit ground, and the source/drain impedance of $Q_2$ being connected between node D and circuit ground; and II. means for presetting a common initial potential $V_I$ at both of nodes C and D between times $t_o$ and $t_1$.

5. A circuit is recited in claim 4, wherein $V_I = V_R$.

6. A circuit as recited in claim 5, wherein means (II) of claim 4 and means (C) of claim 13 comprise means for temporarily connecting nodes A, B, C and D together between cycle times $t_o$ and $t_1$ so as to equalize the initial potential on all four nodes at a common reference potential $V_R$ equal to approximately half of $V_o$.

7. A circuit as recited in claim 6, further comprising means for connecting node D to node A cycle time $t_2$ to refresh the charge originally stored on the selected cell capacitor.

* * * * *

UNITED STATES PATENT AND TRADEMARK OFFICE
CERTIFICATE OF CORRECTION

PATENT NO. : 4,004,284
DATED : January 18, 1977
INVENTOR(S) : RICHARD H. HEEREN

It is certified that error appears in the above-identified patent and that said Letters Patent are hereby corrected as shown below:

Column 2, line 30, after "FIG. 2" delete --, including 2A through 2I,--.

Column 12, claim 4, line 64, before "a" insert --I--.

Column 14, claim 7, line 5, after "A" insert --after--.

Signed and Sealed this

Fourth Day of December 1979

[SEAL]

Attest:

SIDNEY A. DIAMOND

Attesting Officer

Commissioner of Patents and Trademarks